United States Patent
Osada et al.

(10) Patent No.: US 8,253,227 B2
(45) Date of Patent: Aug. 28, 2012

(54) SEMICONDUCTOR INTEGRATED CIRCUIT DEVICE

(75) Inventors: Kenichi Osada, Tokyo (JP); Makoto Saen, Kodaira (JP); Futoshi Furuta, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 322 days.

(21) Appl. No.: 12/606,812

(22) Filed: Oct. 27, 2009

(65) Prior Publication Data

US 2010/0109096 A1 May 6, 2010

(30) Foreign Application Priority Data

Oct. 31, 2008 (JP) .................................. 2008-281711

(51) Int. Cl.
*H01L 23/02* (2006.01)

(52) U.S. Cl. ........ 257/685; 257/401; 257/686; 257/691; 257/E25.013

(58) Field of Classification Search .................. 257/401, 257/685, 686, 691, 692, 693, E25.013, 777
See application file for complete search history.

(56) References Cited

U.S. PATENT DOCUMENTS

| | | | | |
|---|---|---|---|---|
| 5,563,820 A * | 10/1996 | Wada et al. | ...................... | 365/63 |
| 7,924,592 B2 * | 4/2011 | Kang et al. | ...................... | 365/63 |
| 2002/0036338 A1 | 3/2002 | Matsuo et al. | | |
| 2005/0035436 A1 * | 2/2005 | Novak et al. | .................. | 257/678 |
| 2007/0281374 A1 * | 12/2007 | Lee et al. | ......................... | 438/14 |

FOREIGN PATENT DOCUMENTS

JP 2002-176137 A 6/2002
JP 2005-129881 A 5/2005

* cited by examiner

*Primary Examiner* — Zandra Smith
*Assistant Examiner* — Paul Patton
(74) *Attorney, Agent, or Firm* — Miles & Stockbridge P.C.

(57) ABSTRACT

A semiconductor integrated circuit device capable of achieving improvement of I/O processing performance, reduction of power consumption, and reduction of cost is provided. Provided is a semiconductor integrated circuit device including, for example, a plurality of semiconductor chips stacked and mounted, the chips having data transceiving terminals bus-connected via through-vias, and data transmission and reception are performed via the bus with using the lowest source voltage among source voltages of internal core circuits of the chips. In accordance with that, a source voltage terminal of an n-th chip to be at the lowest source voltage is connected with source voltage terminals for data transceiving circuits of the other semiconductor chips via through-vias.

9 Claims, 6 Drawing Sheets

SEMICONDUCTOR INTEGRATED CIRCUIT DEVICE

CROSS-REFERENCE TO RELATED APPLICATION

The present application claims priority from Japanese Patent Application No. JP 2008-281711 filed on Oct. 31, 2008, the content of which is hereby incorporated by reference into this application.

TECHNICAL FIELD OF THE INVENTION

The present invention relates to a semiconductor integrated circuit device. More particularly, the present invention relates to a technique effectively applied to a semiconductor device of SiP (system in package) etc. configured by stacking a plurality of semiconductor chips on which microprocessors, memories, or others are integrated.

BACKGROUND OF THE INVENTION

For example, Japanese Patent Application Laid-Open Publication No. 2002-176137 (Patent Document 1) discloses a stacked-type semiconductor device having a plurality of semiconductor integrated circuit chips stacked on a base board, each semiconductor integrated circuit chip being connected to another chip via a through plug penetrating the chip or BGA (ball grid array). In this stacked-type semiconductor device, the heat dissipation efficiency etc. are improved by, for example, stacking the chips in decreasing order of power consumption.

Also, Japanese Patent Application Laid-Open Publication No. 2005-129881 (Patent Document 2) discloses a three-dimensional semiconductor integrated circuit device configured with two semiconductor chips and a wiring base chip, in which planes of the chips including connecting terminals face each other with being electrically and mechanically connected to each other. This three-dimensional semiconductor integrated circuit device is configured to interface between the chips by the amplitude of the source voltage used in the microfabrication process.

SUMMARY OF THE INVENTION

Along with microfabrication in the semiconductor manufacture technology, lack of I/O performance of semiconductor chips have been becoming a serious issue. The reason is as follows. Since operation of respective circuits become faster as the number of circuits mounted on a semiconductor chip is increased along with microfabrication, the I/O throughput required for the semiconductor chip to achieve desired functions is increased. Meanwhile, the number of terminals of the semiconductor chip is basically determined by the chip size because it is limited by wire-bonding etc., and the number of terminals is not increased by microfabrication.

To solve the lack of I/O performance of semiconductor chips, as described in Patent Document 1, for example, a technique of three-dimensionally stacking a plurality of semiconductor chips on each other's top and bottom surfaces and transmitting information between the stacked chips by a through-via is considered. In this manner, when the semiconductor chips are stacked three-dimensionally as they are and connected, communication is normally made by a circuit only for input/output which is operated at a voltage higher than a core voltage. However, reduction of power consumption and achievement of low cost are particularly important for such a stacked structure, and thus the I/O performance is desired to be improved in consideration of these factors.

Meanwhile, Patent Document 2 discloses a technique of electrically and mechanically connecting a plurality of chips with their surfaces including connection terminals and facing each other, and interfacing between the chips at the amplitude of the source voltage used in the microfabrication process. However, this method connects chips face-to-face by bumps, and thus only two chips can be stacked. Therefore, to connect three or more chips, the chips have to be horizontally placed next to each other, and thus the distance of communication is increased and it poses a problem of I/O performance lowering.

The present invention has been made in consideration of the above points, and the above and other preferred aims and novel characteristics of the present invention will be apparent from the description of the present specification and the accompanying drawings.

The typical ones of the inventions disclosed in the present application will be briefly described as follows.

A semiconductor integrated circuit device according to an embodiment has a plurality of (particularly, three or more) semiconductor chips three-dimensionally stacked, in which each semiconductor chip is applied with the lowest source voltage among source voltages used for internal core circuits of all of the chips via a through-via, and the source voltage mentioned above is used when data communication is performed by each of the chips via the through-via. By using such a configuration, it becomes possible to reduce power consumption and also improve I/O processing performance. Also, it is unnecessary to form transistors having different breakdown voltages in each semiconductor chip, and, in addition, the source voltage upon data communication can be supplied by one through-via. Thus, area efficiency or mounting efficiency of each semiconductor chip can be increased. Consequently, with reducing manufacturing cost, I/O processing performance can be improved.

When the effects obtained by typical aspects of the present invention disclosed in the application is briefly described, reduction of power consumption and improvement of I/O processing performance can be achieved.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference symbols throughout the drawings for describing the embodiments, and the repetitive description thereof is omitted.

First Embodiment

Figure 1:
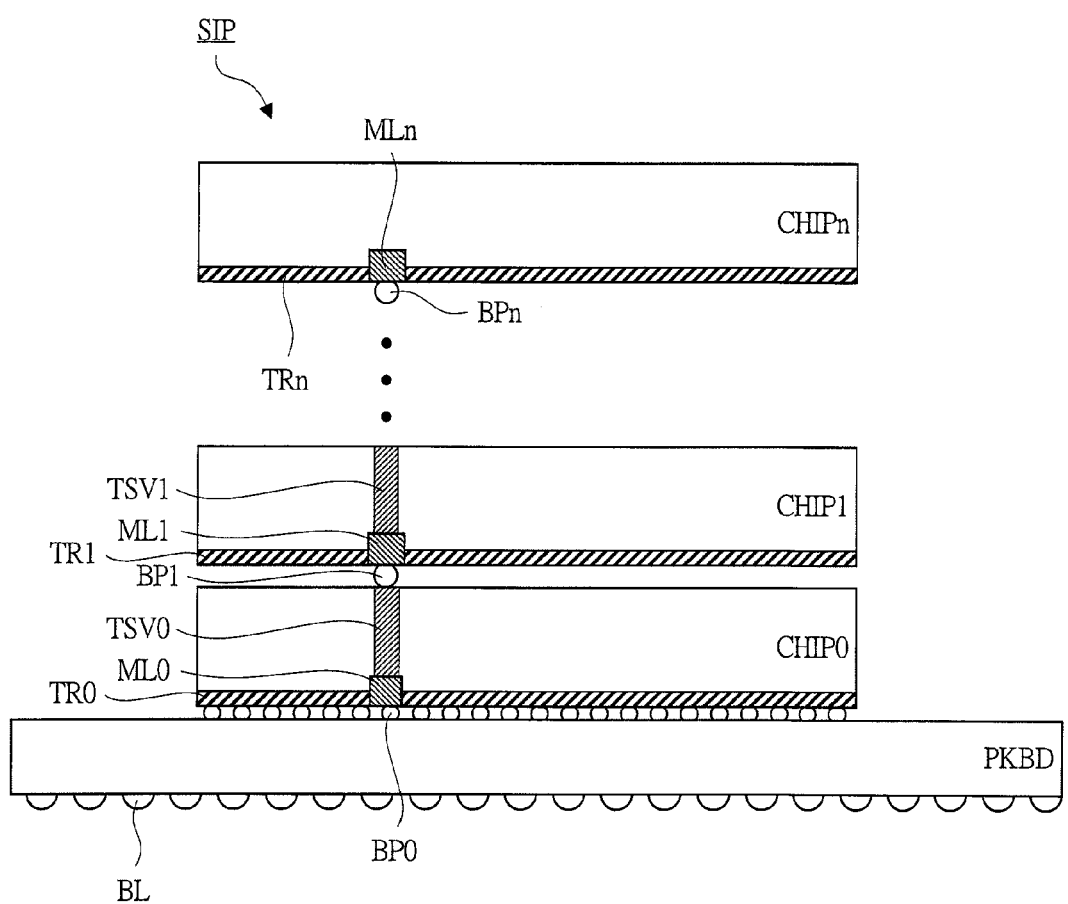
FIG. 1 is a cross-sectional view illustrating an example of an outer shape of a semiconductor integrated circuit device according to a first embodiment of the present invention.

FIG. 1 is a cross-sectional view illustrating an example of an outer shape of a semiconductor integrated circuit device according to a first embodiment of the present invention. A semiconductor integrated circuit device SIP illustrated in FIG. 1 has a configuration of the system-in-package in which a plurality of ((n+1) pieces of) semiconductor chips CHIP0 to CHIPn are sequentially stacked and mounted on a package board PKBD. The CHIP0 to CHIPn are arranged to have their transistor-forming surfaces TR0 to TRn facing downwards. A terminal (bump) BP0 is formed to the transistor-forming surface TR0 of the CHIP0 and is connected to a terminal on a top surface of the PKBD. The terminal on the top surface of the PKBD is connected to a terminal (ball) BL formed on a bottom surface of the PKBD via a wiring layer formed inside, and the BL is connected to a mother board and so forth which are not illustrated.

Each circuit formed on the TR0 side of the CHIP0 is connected to the bump BP1 formed on the TR1 side of the CHIP1 via a wiring layer ML0 formed on the TR0 side and a through-via TSV0, and connected to each circuit formed on the TR1 side of the CHIP1 via the BP1 and a wiring layer ML1 connected with the BP1. In the same manner, each circuit formed on the TR1 side of the CHIP1 is connected to an upper semiconductor chip via the wiring layer ML1 and a through-via TSV1, and finally, the circuits of the CHIP0 to CHIPn are connected via the bumps BP0 to BPn, wiring layers ML0 to MLn, and through-vias TSV0 to TSVn-1 (not illustrated), respectively. The through-via TSV is, as widely known, for example, formed with using silicon material such as poly-silicon, or formed with using metal material such as copper. Also, each of the CHIP0 to CHIPn is a microprocessor chip or a memory chip, but it can be another kind of chip, and a function of each chip is not particularly limited.

Figure 2:
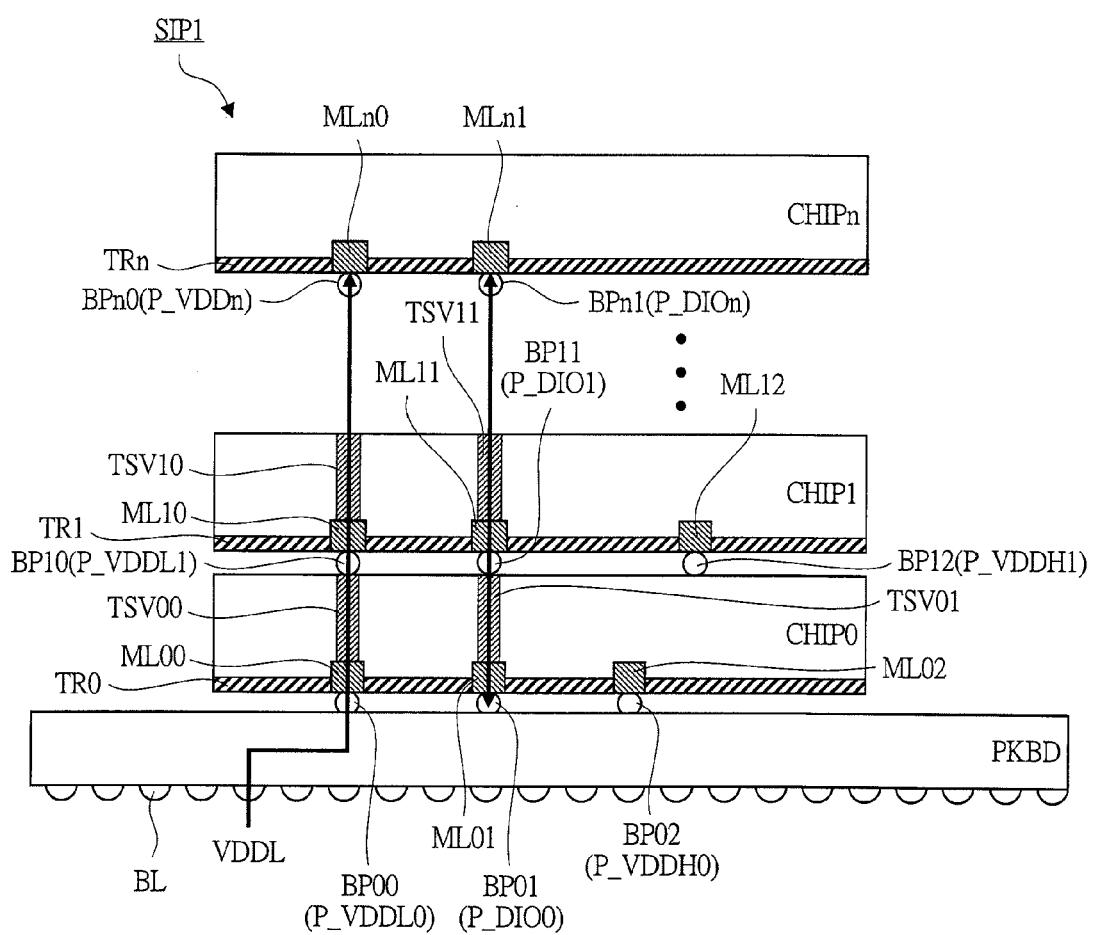
FIG. 2 is a cross-sectional view illustrating an example of the outer shape of the semiconductor integrated circuit device of FIG. 1 in more detail.
Figure 3:
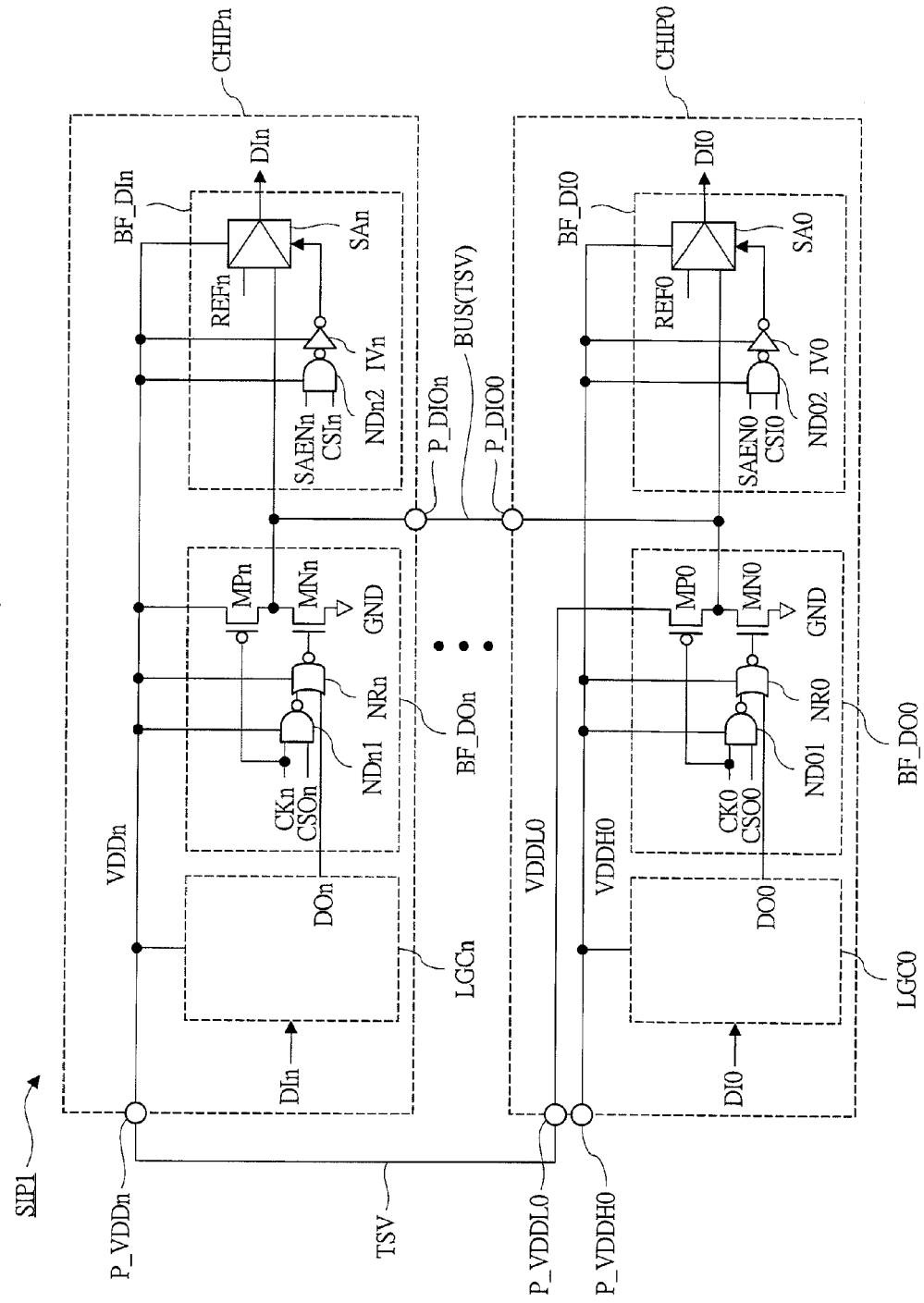
FIG. 3 is a circuit diagram illustrating a circuit configuration example corresponding to FIG. 2.

FIG. 2 is a cross-sectional view illustrating an example of the outer shape of the semiconductor integrated circuit device of FIG. 1 in more detail. FIG. 3 is a circuit diagram illustrating a circuit configuration example corresponding to FIG. 2. A semiconductor integrated circuit device SIP1 illustrated in FIG. 2 is configured by the plurality of semiconductor chips CHIP0 to CHIPn similarly to FIG. 1. The CHIP0 has a bump BP02 (P_VDDH0) to be a source voltage terminal for a high voltage and a bump BP00 (P_VDDL0) to be a source voltage terminal for a low voltage, and similarly, the CHIP1 also has a bump BP12 (P_VDDH1) to be a source voltage terminal for a high voltage and a bump BP10 (P_VDDL1) to be a source voltage terminal for a low voltage. On the other hand, the CHIPn has a bump BPn0 (P_VDDn) to be one source voltage terminal. Here, the CHIPn has a specification of the source voltage to be used in a core circuit inside the CHIPn being the lowest among those of the other semiconductor chips CHIP0 to CHIPn-1 (not illustrated).

In such a configuration, a main feature of the semiconductor integrated circuit device SIP1 of the first embodiment is that the source voltage of the internal core circuit of the CHIPn is supplied to all the semiconductor chips CHIP0 to CHIPn via one through-via path. That is, a source voltage VDDL is applied from the ball BL of the package board PKBD, and the VDDL is supplied via the bump BP00, wiring layer ML00, and through-via TSV00 of the CHIP0, and further, via the bump BP10, wiring layer ML10, and through-via TSV10 of the CHIP1, and thereafter, the VDDL is supplied to the bump BPn0 and wiring layer MLn0 of the CHIPn in the same manner.

Also, the CHIP0, CHIP1, . . . , CHIPn have bumps BP01 (P_DIO0), BP11 (P_DIO1), . . . , BPn1 (P_DIOn) to be data transceiving terminal, respectively. These data transceiving terminals are bus-connected to each other via a wiring layer ML01 and a through-via TSV01 of the CHIP0, a wiring layer ML11 and a through-via TSV11 of the CHIP1, and thereafter, via a wiring layer MLn1 of the CHIPn in the same manner. Here, the inventors of the present invention and others have found out in their study that, when each of the semiconductor chips CHIP0 to CHIPn is three-dimensionally stacked in this manner, they are close to each other and a load capacitance of the bus can be small, and thus, a high voltage for only input/output which has been conventionally and generally used is unnecessary. Accordingly, as illustrated in FIG. 3, a main feature of the semiconductor integrated circuit device SIP1 of the first embodiment is that a source voltage of the internal core circuit of the CHIPn described above is used upon data communication using the bus.

In FIG. 3, the CHIP0 has an internal core circuit LGC0 achieving a predetermined function, a data transmitting circuit BF_DO0, and a data receiving circuit BF_DI0, and is supplied with a high source voltage VDDH0 from the source voltage terminal P_VDDH0 and also a low source voltage VDDH0 from the source voltage terminal P_VDDL0. The LGC0 is operated at the VDDH0. The BF_DO0 is configured by, for example, a NAND circuit ND01, a NOR circuit NR0, a PMIS (P-metal-insulator-semiconductor) transistor MP0 and an NMIS transistor MN0 for output. The ND01 is operated at the VDDH0, and inputted with a clock signal CK0 and a transmission select signal CSO0. An output of the ND01 is connected to one of inputs of the NR0. The NR0 is operated at the VDDH0, and the output of the ND01 is transmitted to the one of the inputs of the NR0, and a transmission data signal DO0 from the LGC0 is transmitted to the other input. The MN0 has a source connected to a ground voltage GND, a gate connected to the output of the NR0, and a drain connected to a drain of the MP0. In the MP0, a gate is applied with the CK0, a source is supplied with the VDDL0, and its drain is connected to the data transceiving terminal P_DIO0.

The BF_DI0 is configured by a NAND circuit ND02, an inverter circuit IV0, and a sense amplifier circuit SA0. The ND02 is operated at the VDDH0, and inputted with a sense-amplifier activating signal SAEN0 and a receive select signal CSI0. The IV0 is operated at the VDDH0, and inverts the output of the ND02 and outputs it to the SA0. The SA0 is operated at the VDDH0, and a receive signal from the P_DIO0 is inputted to one input of the SA0, and a reference voltage REF0 is inputted to the other input. The SA0 is activated based on an output logic level from the IV0, and after performing differential amplification, it outputs a receive data signal DI0. The LGC0 performs a predetermined processing as the DI0 is inputted, and then, outputs the DO0 described above. Although not particularly limited, the SA0 is achieved by a general differential amplifier circuit having, for example, a MIS transistor pair to be a differential pair, a load element of the pair, and a MIS transistor to be a tail current source and to switch activation and deactivation.

The CHIPn has an internal core circuit LGCn achieving a predetermined function, a data transmitting circuit BF_DOn, and a data receiving circuit BF_DIn, and is supplied with the source voltage VDDn from the source voltage terminal P_VDDn. In the same manner with the CHIP0, the BF_DOn includes a NAND circuit NDn1, a NOR circuit NRn, and a PMIS transistor MPn and an NMIS transistor MNn, and is operated with using a transmission data signal DOn, a clock signal CKn, and a transmission select signal CSOn. The BF_DIn also includes a NAND circuit NDn2, an inverter circuit IVn, and a sense amplifier circuit SAn, and is operated as a sense-amplifier activating signal SAENn, a receive select signal CSIn, and a reference voltage REFn are inputted, and outputs a receive data signal DIn. The LGCn performs a predetermined processing as the DIn is inputted, and then, outputs the DOn described above. Note that each of the circuit of the CHIPn (LGCn, BF_DOn, or BF_DIn) is operated at the VDDn different from the CHIP0.

Here, the data transceiving terminal P_DIOn of the CHIPn and the data transceiving terminal P_DIO0 of the CHIP0 are, as described in FIG. 2, connected to each other as a bus BUS via a through-via TSV. Also, the source voltage terminal P_VDDn of the CHIPn and the source voltage terminal P_VDDL0 on the low voltage side of the CHIP0 are connected via the through-via TSV. Further, in such a configuration, a main feature is that each of the semiconductor chips CHIP0 to CHIPn includes the MIS transistors included therein which are designed to have uniform breakdown voltage specification (such as a thickness of a gate insulating film). That is, the MIS transistors included in each circuit (LGCn, BF_DOn, or BF_DIn) of the CHIPn are designed to have uniform breakdown voltage specification (i.e., breakdown voltage specification of VDDn), and the MIS transistors included in each circuit (LGC0, BF_DO0, or BF_DI0) of the CHIP0 are also designed to have uniform breakdown voltage specification (i.e., breakdown voltage specification of VDDH0). Therefore, manufacturing process of each of the semiconductor chips CHIP0 to CHIPn can be simplified, so that a cost reduction is achieved. Further, as illustrated in FIGS. 2 and 3, the interface source voltages (VDDn and VDDL0) for data communication can be commonly supplied via the one through-via TSV, so that the area efficiency of each semiconductor chip can be improved and the mounting efficiency of stacked mounting can be improved. This also can achieve cost reduction.

Figure 4:
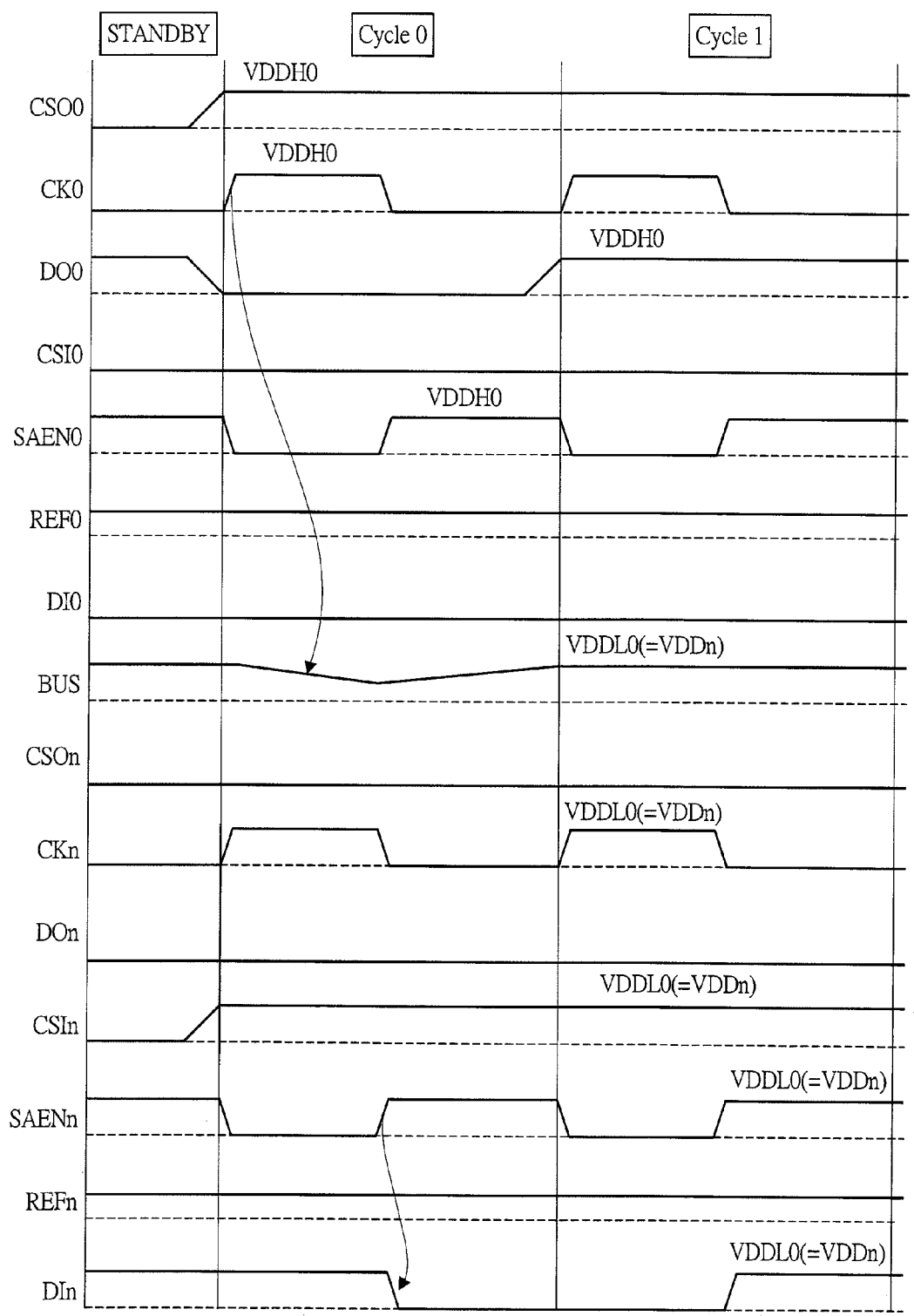
FIG. 4 is a waveform diagram illustrating an example of operation of the semiconductor integrated circuit device of FIG. 3.

FIG. 4 is a waveform diagram illustrating an example of operation of the semiconductor integrated circuit device of FIG. 3. FIG. 4 illustrates an operation example of transmitting data from the data transmitting circuit BF_DO0 of the CHIP0 to the data receiving circuit BF_DIn of the CHIPn. When data is transmitted from the CHIP0, the transmission selection signal CSO0 is changed from low level (hereinafter, denoted by 'L') to high level (hereinafter, denoted by 'H') and output data is set to DO0. Here, a case in which data '0' is outputted in the first cycle (Cycle0) and data '1' is outputted in the next cycle (Cycle1) is illustrated.

In the period in which the clock signal CK0 is 'L', the MP0 is in an ON state and the BUS is precharged to the VDDL0 (=VDDn) which is a low voltage. Similarly, the MPn of the data transmitting circuit BF_DOn of the CHIPn is also in an ON state, and the BUS is precharged to the VDDL0 (=VDDn). In addition, the CK0 of the CHIP0 and the CKn of the CHIPn are synchronized. When the CK0 is transited from 'L' to 'H', data transmission is started. Along with 'L' output of the ND01 and '0' of the DO0, the MN0 is transited to an ON state, and the charges precharged in the BUS are pulled out. Note that, here, driving ability of the MN0 is adjusted to lengthen the period of pulling out to the GND, so that the amplitude is reduced and also power consumption is reduced. Meanwhile, this period can be shortened, of course.

In the data receiving circuit BF_DIn of the CHIPn, the receive select signal CSIn is set to 'H', and the sense amplifier circuit SAn is activated in synchronization with the sense-amplifier activating signal SAENn. The sense amplifier circuit SAn compares a potential difference of the reference voltage REFn and the BUS, amplifies the difference, and outputs an amplified result as the receive data signal DIn. The REFn is set to, for example, ½×VDDn etc. depending on the driving ability of the MNn.

Also, in the Cycle1, the MN0 is maintained in an OFF state along with 'L' output of the ND01 and '1' of the DO0, and the precharged potential of the BUS remains to be unchanged. The SAn compares potentials of the REFn and the BUS, amplifies the potentials, and outputs a value opposite to that of Cycle0 as the DIn. In this manner, by performing data communication using the precharge method, power consumption can be reduced by, for example, a CMOS circuit and so forth as compared with the method of driving the BUS at both '1' level and '0' level. Note that, while the sequence is performed in the same manner when data is transmitted from the data transmitting circuit BF_DOn of the CHIPn to the data receiving circuit BF_DI0 of the CHIP0, the SA0 of the BF_DI0 of the CHIP0 is different from the SAn and is level-shifted from the voltage of low amplitude (VDDL0 (=VDDn)) to the voltage of high amplitude (VDDH0).

Typical effects obtained by the semiconductor integrated circuit device of the first embodiment described above are summarized as follows. First, as illustrated in FIGS. 2 to 4, data communication among a plurality of semiconductor chips can be performed in a short communication distance via a through-via and also at a low voltage, so that reduction of power consumption and improvement of I/O processing performance can be achieved. Note that, to achieve further improvement of I/O processing performance, it is preferable to stack three or more semiconductor chips. In addition, since data communication is performed at a low voltage which is lower than or equal to the voltage used in the internal core circuit of each semiconductor chip, the voltage is always under the breakdown voltage of the MIS transistors used in each semiconductor chip, and thus a MIS transistor having a thick gate insulating film is unnecessary, so that the manufacture process can be simplified. Further, since the low voltage relating to the data communication can be supplied via one through-via, area efficiency of each semiconductor chip and mounting efficiency upon stacking of the same can be improved. According to these factors, cost reduction and improvement of I/O processing performance can be achieved.

Second Embodiment

In the first embodiment described above, the lowest source voltage among the source voltages used in the internal core circuits of respective semiconductor chips has been used as the source voltage for data communication. However, in a second embodiment, an example in which data communication is performed at a voltage lower than the lowest source voltage will be described.

Figure 5:
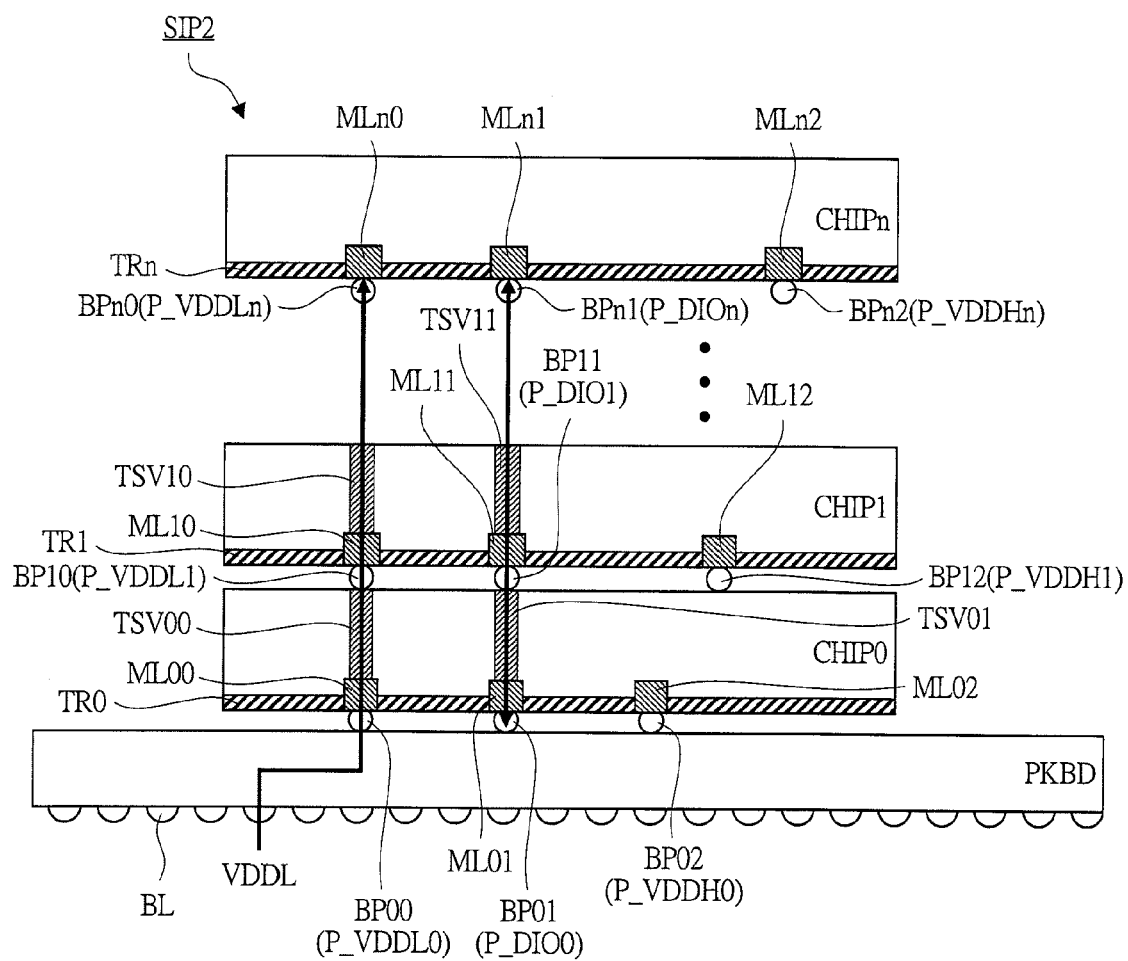
FIG. 5 is a cross-sectional view illustrating an example of an outer shape of a semiconductor integrated circuit device according to a second embodiment in more detail than FIG. 1.

FIG. 5 is a cross-sectional view illustrating an example of an outer shape of the semiconductor integrated circuit device according to the second embodiment of the present invention in more detail than FIG. 1. A semiconductor integrated circuit device SIP2 illustrated in FIG. 5 is different from the semiconductor integrated circuit device SIP1 of FIG. 2 in that a bump BPn2 (P_VDDHn) to be a source voltage terminal for an internal core circuit is added to the semiconductor chip CHIPn. Since the second embodiment is the same with FIG. 2 in the configurations other than the difference, detailed descriptions thereof will be omitted.

Figure 6:
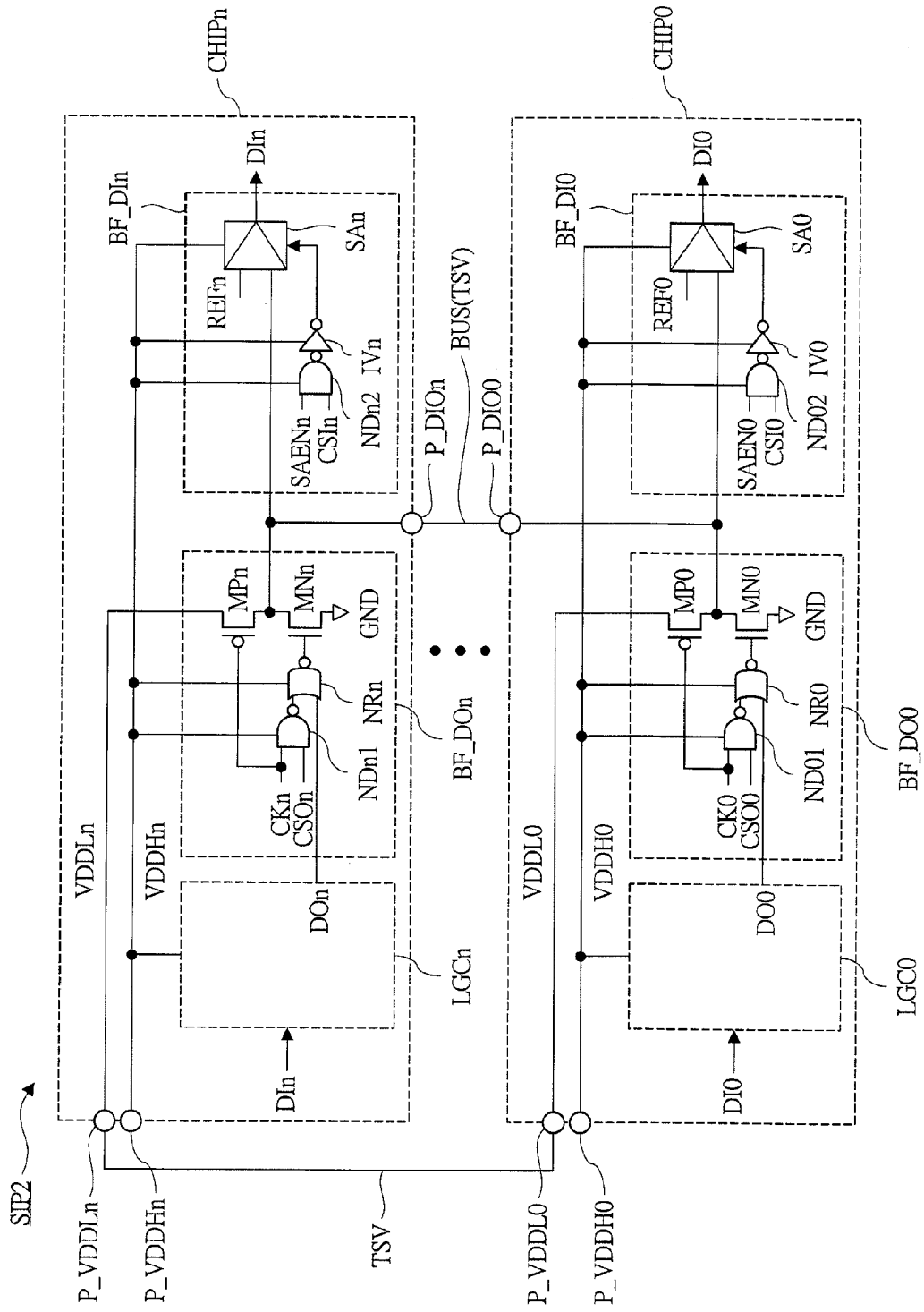
FIG. 6 is a circuit diagram illustrating a circuit configuration example corresponding to FIG. 5.

FIG. 6 is a circuit diagram illustrating a circuit configuration example corresponding to FIG. 5. The circuit example illustrated in FIG. 6 is different from the circuit example of FIG. 3 in the power source used in each circuit of the semiconductor chip CHIPn, and other than that, it is the same with the circuit example of FIG. 3. To the CHIPn of FIG. 6, the high source voltage VDDHn is supplied via the source voltage terminal P_VDDHn, and also the low source voltage VDDLn via the source voltage terminal P_VDDLn. And, the VDDLn is supplied to the source of the PMIS transistor MPn inside the data transmitting circuit BF_DOn of the CHIPn, and the VDDHn is supplied to the other circuits (i.e., the internal core circuit LGCn of the CHIPn is included).

Also, the P_VDDLn is connected with the source voltage terminal P_VDDL0 of the semiconductor chip CHIP0 via the through-via TSV, so that the VDDLn of the CHIPn and the VDDL0 of the CHIP0 are equally set. Relationships among the source voltages are expressed such that VDDLn (=VDDL0)<VDDHn and VDDLn (=VDDL0)<VDDH0. Here, the MIS transistors included in each circuit (LGCn, BF_DOn, and BF_DIn) of the CHIPn are designed to have uniform breakdown voltage specification (i.e., breakdown voltage specification of VDDHn), and the MIS transistors included in each circuit (LGC0, BF_DO0, and BF_DI0) of the CHIP0 are also designed to have a uniform breakdown voltage specification (i.e., a breakdown voltage specification of VDDH0).

When the semiconductor integrated circuit device of the second embodiment in the manner described above, in addition to these various effects as described above in the first embodiment, the voltage relating to data communication is further lowered, so that further power consumption reduction can be achieved.

In the foregoing, the invention made by the inventors has been concretely described based on the embodiments. However, it is needless to say that the present invention is not limited to the foregoing embodiments and various modifications and alterations can be made within the scope of the present invention.

The semiconductor integrated circuit devices according to the present embodiments are particularly beneficially used for an SiP and so forth in which a plurality of semiconductor chips including a microprocessor, a memory or the like are stacked and the semiconductor chips are connected to each other via through-vias.

What is claimed is:

1. A semiconductor integrated circuit device comprising:
a first semiconductor chip including a first internal core circuit achieving a predetermined processing function and operated at a first operating voltage, a first data transceiving circuit playing a role of interfacing with the outside, a first data transceiving terminal, and a first source voltage terminal; and
a second semiconductor chip including a second internal core circuit achieving a predetermined processing function and operated at a second operating voltage, a second data transceiving circuit playing a role of interfacing with the outside, a second data transceiving terminal, and a second source voltage terminal, wherein
one of the first semiconductor chip and the second semiconductor chip is stacked and mounted on the other,
the first data transceiving terminal and the second data transceiving terminal are connected via a first through-via,
the first source voltage terminal and the second source voltage terminal are connected via a second through-via,
a source voltage lower than the first operating voltage and the second operating voltage is supplied to the second through-via,
the first data transceiving circuit and the second data transceiving circuit perform data transmission and reception via the first through-via using the source voltage, and
a distance between the first source voltage terminal and the first data transceiving terminal is equal to a distance between the second source voltage terminal and the second data transceiving terminal.

2. The semiconductor integrated circuit device according to claim 1, wherein
a thickness of a gate insulating film of a MIS transistor used in the first internal core circuit is equal to a thickness of a gate insulating film of a MIS transistor used in the first data transceiving circuit, and
a thickness of a gate insulating film of a MIS transistor used in the second internal core circuit is equal to a thickness of a gate insulating film of a MIS transistor used in the second data transceiving circuit.

3. The semiconductor integrated circuit device according to claim 1, wherein
each of the first data transceiving circuit and the second data transceiving circuit has a precharge circuit, and
the precharge circuit precharges the first through-via to the source voltage at every clock cycle.

4. A semiconductor integrated circuit device comprising:
a first semiconductor chip including a first internal core circuit achieving a predetermined processing function and operated at a first operating voltage, a first data transceiving circuit playing a role of interfacing with the outside, a first data transceiving terminal, and a first source voltage terminal;
a second semiconductor chip including a second internal core circuit achieving a predetermined processing function and operated at a second operating voltage, a second data transceiving circuit playing a role of interfacing with the outside, a second data transceiving terminal, and a second source voltage terminal; and a third semiconductor chip including a third internal core circuit achieving a predetermined processing function and operated at a third operating voltage, a third data transceiving circuit playing a role of interfacing with the outside, a third data transceiving terminal, and a third source voltage terminal, wherein the first semiconductor chip, the second semiconductor chip, and the third semiconductor chip are mounted in a stack, the first data transceiving terminal, the second data transceiving terminal, and the third data transceiving terminal are connected via a first through-via, the first source voltage terminal, the second source voltage terminal, and the third source voltage terminal are connected via a second through-via, a source voltage lower than the first operating voltage, the second operating voltage, and the third operating voltage is supplied to the second through-via, and the first data transceiving circuit, the second data transceiving circuit, and the third data transceiving circuit perform data transmission and reception via the first through-via using the source voltage.

5. The semiconductor integrated circuit device according to claim 4, wherein a distance between the first source voltage terminal and the first data transceiving terminal is equal to a distance between the second source voltage terminal and the second data transceiving terminal and a distance between the third source voltage terminal and the third data transceiving terminal.

6. The semiconductor integrated circuit device according to claim 4, wherein a thickness of a gate insulating film of a MIS transistor used in the first internal core circuit is equal to a thickness of a gate insulating film of a MIS transistor used in the first data transceiving circuit, a thickness of a gate insulating film of a MIS transistor used in the second internal core circuit is equal to a thickness of a gate insulating film of a MIS transistor used in the second data transceiving circuit, and a thickness of a gate insulating film of a MIS transistor used in the third internal core circuit is equal to a thickness of a gate insulating film of a MIS transistor used in the third data transceiving circuit.

7. The semiconductor integrated circuit device according to claim 4, wherein each of the first data transceiving circuit, the second data transceiving circuit, and the third data transceiving circuit has a precharge circuit, and the precharge circuit precharges the first through-via to the source voltage at every clock cycle.

8. The semiconductor integrated circuit device according to claim 1, wherein the first operating voltage is different from the second operating voltage.

9. The semiconductor integrated circuit device according to claim 4, wherein at least one of the first operating voltage, he second operating voltage, and the third operating voltage is different from the others.

* * * * *